(12) United States Patent
Paik et al.

(10) Patent No.: US 11,068,774 B2
(45) Date of Patent: Jul. 20, 2021

(54) SPIKING NEURAL NETWORK SYSTEM FOR DYNAMIC CONTROL OF FLEXIBLE, STABLE AND HYBRID MEMORY STORAGE

(71) Applicant: Korea Advanced Institute of Science and Technology, Daejeon (KR)

(72) Inventors: Se-Bum Paik, Daejeon (KR); Youngjin Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 965 days.

(21) Appl. No.: 15/720,772

(22) Filed: Sep. 29, 2017

(65) Prior Publication Data

US 2018/0197076 A1  Jul. 12, 2018

(30) Foreign Application Priority Data

Dec. 1, 2016 (KR) .................. 10-2016-0162934
Aug. 28, 2017 (KR) .................. 10-2017-0108470

(51) Int. Cl.
| G06N 3/063 | (2006.01) |
| G06N 3/04 | (2006.01) |
| G06N 3/08 | (2006.01) |
| G11C 11/54 | (2006.01) |
| G11C 11/16 | (2006.01) |

(52) U.S. Cl.
CPC ............. G06N 3/063 (2013.01); G06N 3/049 (2013.01); G06N 3/08 (2013.01); G11C 11/1675 (2013.01); G11C 11/54 (2013.01)

(58) Field of Classification Search
CPC .......... G06N 3/063; G06N 3/049; G06N 3/08; G11C 11/1675; G11C 11/54
See application file for complete search history.

(56) References Cited

U.S. PATENT DOCUMENTS

2013/0325775 A1* 12/2013 Sinyavskiy ............ G06N 20/00
706/25
2015/0318040 A1* 11/2015 Miao .................. G11C 13/0002
365/163

(Continued)

FOREIGN PATENT DOCUMENTS

KR  10-2013-0036325  4/2013

OTHER PUBLICATIONS

Tully, Philip J., Matthias H. Hennig, and Anders Lansner. "Synaptic and nonsynaptic plasticity approximating probabilistic inference." Frontiers in synaptic neuroscience 6 (2014): 8. (Year: 2014).*

(Continued)

Primary Examiner — Michael J Huntley
Assistant Examiner — Ahsif A. Sheikh
(74) Attorney, Agent, or Firm — Blank Rome LLP

(57) ABSTRACT

Provided is a spiking neural network system for dynamical control of flexible, stable, and hybrid memory storage. An information storage method may include converting input information to a temporal pattern in a form of a spike; and storing the information that is converted to the temporal pattern in a spiking neural network. The storing may comprise storing information by applying, to the spiking neural network, a spike-timing-dependent plasticity (STDP) learning rate that is an unsupervised learning rule.

13 Claims, 11 Drawing Sheets

(56) References Cited

U.S. PATENT DOCUMENTS

2016/0034812 A1\* 2/2016 Gibson .................... G06N 3/08
            706/25
2016/0260012 A1\* 9/2016 Hunzinger ............. G06N 3/063

OTHER PUBLICATIONS

Bush D, Philippides A, Husbands P, O'Shea M (2010) Dual Coding with STDP in a Spiking Recurrent Neural Network Model of the Hippocampus. PLOS Computational Biology 6(7): e1000839. (Year: 2010).\*

\* cited by examiner

SPIKING NEURAL NETWORK SYSTEM FOR DYNAMIC CONTROL OF FLEXIBLE, STABLE AND HYBRID MEMORY STORAGE

CROSS-REFERENCE TO RELATED APPLICATION

This application claims the priority benefit of Korean Patent Application No. 10-2016-0162934, filed on Dec. 1, 2016, and Korean Patent Application No. 10-2017-0108470, filed on Aug. 28, 2017, in the Korean Intellectual Property Office, the disclosure of which is incorporated herein by reference.

BACKGROUND

1. Field of the Invention

The following example embodiments relate to a method of selectively storing and controlling information using a neural network.

2. Description of the Related Art

Technology for training a spiking neural network based on spike-timing-dependent plasticity (hereinafter, referred to as 'STDP') relates to a learning and information processing scheme of the human brain. Fundamental research on features and algorithms thereof has been actively conducted in the field of neurology and electronic engineering.

Dissimilar to an artificial neural network based on a perceptron or firing rate model, which is generally widely used, a spiking neural network system uses a spike-form signal as an information transfer medium. Thus, the spiking neural network system may perform highly difficult functions, such as high-level recognition, inference, etc., that are considered as actual biological characteristics of the brain.

Methods of storing information in a neural network may not control learning of new information and stable appendability of existing information to be simultaneously performed in a single neural network. That is, such methods have a stability-plasticity dilemma that a loss of existing stored information increases to enhance the efficiency of storing new information and storing of new information becomes impossible to enhance the efficiency of maintaining existing information.

SUMMARY

At least one example embodiment provides a method and system that may select or actively control and change the efficiency of storing new information and the efficiency of maintaining existing information if necessary.

At least one example embodiment also provides a method and system that may outperform a stability-plasticity dilemma by simply changing a learning rate symmetry of a neural network.

According to an aspect of at least one example embodiment, there is provided a computer-implemented information storage method including converting input information to a temporal pattern in a form of a spike; and storing the information that is converted to the temporal pattern in a spiking neural network. The storing includes storing information by applying, to the spiking neural network, a spike-timing-dependent plasticity (STDP) learning rule that is an unsupervised learning rule.

The storing may include controlling a characteristic of information that is stored in the spiking neural network by controlling an individual synaptic stability in the STDP learning rule.

The storing may include controlling a characteristic of information that is stored in the spiking neural network by transforming a learning rate symmetry in the STDP learning rule, and the transforming of the learning rate symmetry may include symmetrically or asymmetrically changing a synaptic weight-dependent learning rate in the STDP learning rule.

The storing may include constructing an asymmetric learning rule of a short-term memory model that forms a volatile memory by controlling an individual synaptic stability in the STDP learning rule.

The storing may include constructing a symmetric learning rule of a long-term memory model that forms a non-volatile memory by controlling an individual synaptic stability in the STDP learning rule.

The storing may include constructing a hybrid learning rule of a hybrid memory model having an intermediate characteristic between an asymmetric learning rule of a short-term memory model that forms a volatile memory and a symmetric learning rule of a long-term memory model that forms a non-volatile memory by controlling an individual synaptic stability in the STDP learning rule.

The constructing of the hybrid learning rule may include constructing the hybrid learning rule through a linear combination of the asymmetric learning rule and the symmetric learning rule.

The storing may include storing information through the STDP learning rule that changes a synaptic strength between an input neuron and an output neuron in the spiking neural network based on a temporal difference between an input spike and an output spike.

The STDP learning rule may strengthen the synaptic strength when the input spike comes before the output spike and may weaken the synaptic strength when the output spike comes before the input spike.

According to an aspect of at least one example embodiment, there is provided a computer-implemented information storage method including converting input information to a temporal pattern in a form of a spike; and storing the information that is converted to the temporal pattern in a spiking neural network. The storing includes storing information by applying an STDP learning rule to the spiking neural network, and by constructing an asymmetric learning rule of a short-term memory model that forms a volatile memory, a symmetric learning rule of a long-term memory model that forms a non-volatile memory, or a hybrid learning rule of a hybrid memory model having an intermediate characteristic between the asymmetric learning rule and the symmetric learning rule by controlling an individual synaptic stability in the STDP learning rule.

According to an aspect of at least one example embodiment, there is provided a computer-implemented information storage system including at least one processor configured to execute computer-readable instructions. The at least one processor is configured to convert input information to a temporal pattern in a form of a spike, and to store the information in a spiking neural network, and the at least one processor is configured to store information by applying an STDP learning rule to the spiking neural network, and to control a characteristic of information that is stored in the spiking neural network by controlling an individual synaptic stability in the STDP learning rule.

According to example embodiments, it is possible to further enhance the technical flexibility of a neural network system by providing functions capable of selecting or actively controlling and changing the efficiency of storing new information and the efficiency of maintaining existing information if necessary.

Also, according to example embodiments, it is possible to outperform a stability-plasticity dilemma that is one of key issues of a neural network system by simply changing a learning rate symmetry of a neural network in a method of storing information in a neural network.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
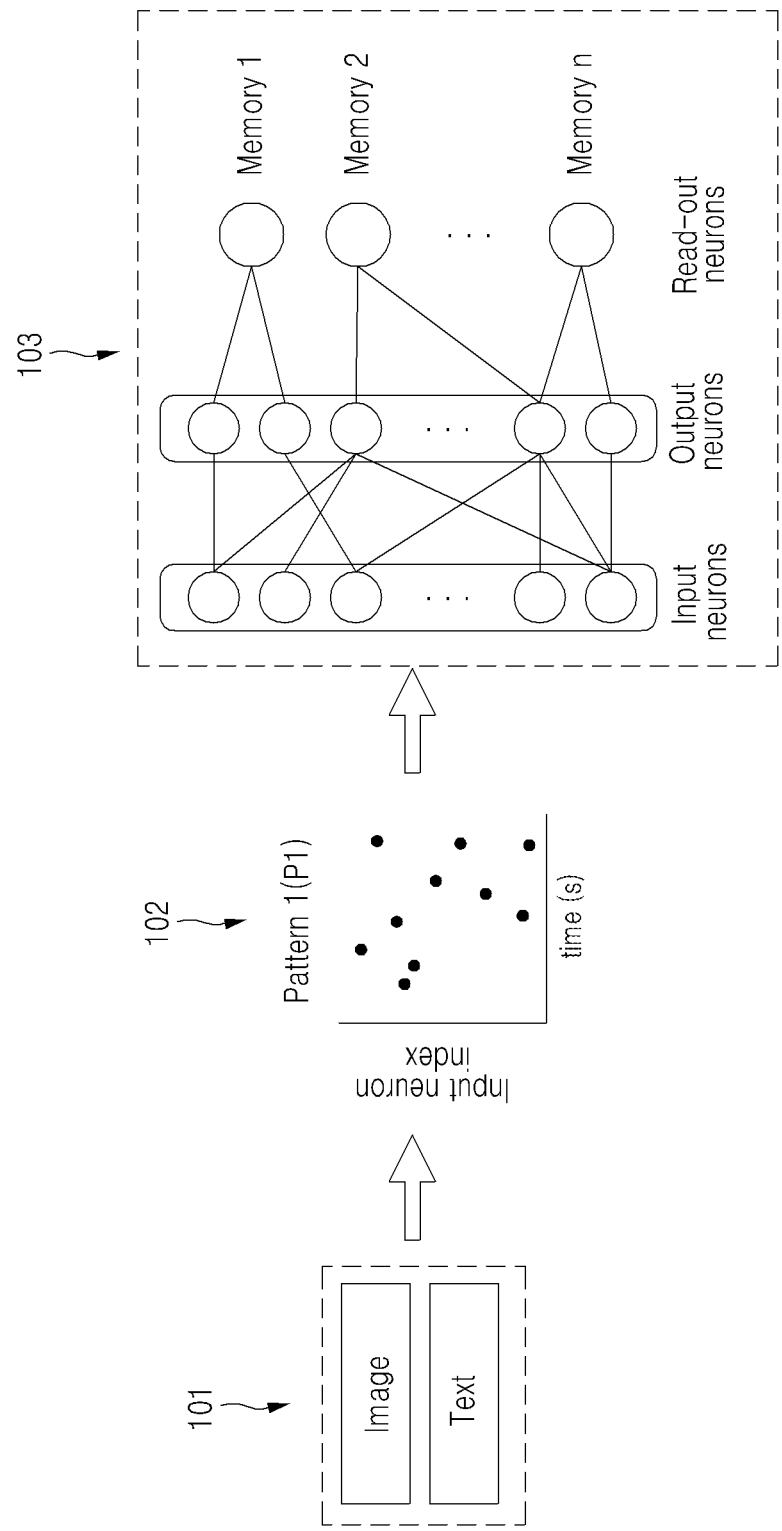
FIG. 1 illustrates an example of a structure of a spiking neural network according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Hereinafter, example embodiments are described with reference to the accompanying drawings.

The example embodiments relate to a method of selectively storing and controlling information using a neural network, and employ a spiking neural network using a learning and information processing scheme of the human brain and a spike-timing-dependent plasticity (STDP) to store and control information in a neural network.

Existing technology for storing information using an STDP learning rule in a spiking neural network does not disclose an active control function that enables stored information to have a characteristic of short-term memory or long-term memory. In detail, existing technologies do not disclose a method of controlling stored information to have a volatile or non-volatile characteristic or actively controlling previously stored information to be overwritten or not to be overwritten by new information appended.

The example embodiments may actively control a characteristic of information stored in a spiking neural network by transforming a learning rate symmetry in an STDP learning rule. In detail, the example embodiments may readily control the sustainability of stored information and the effect by new information by symmetrically or asymmetrically changing a synaptic weight-dependent learning rate of an STDP, which may be regarded as a simple and new method that overcomes some constraints found in the related art by simply transforming a single rule in a neural network model.

That is, the example embodiments may control the stability of an STDP learning rule to generate a characteristic of information stored in a spiking neural network, that is, a long-term memory that is non-volatile and is not affected by new information or a short-term memory that is volatile and easily overwritten by new information, or to form a hybrid memory having an intermediate characteristic between the long-term memory and the short-term memory.

Accordingly, it is possible to construct a system that may actively control and change sustainability and volatility of newly stored information by continuously controlling a learning rate symmetry in a single neural network.

The example embodiments may actively control a characteristic of stored information without transforming a physical synaptic circuit even in a neural network. Also, the learning rate symmetry may be continuously changeable from the perfect symmetry to the complete asymmetry and thus, may be readily selected and transformed depending on whether it is possible to construct the hybrid memory indicating an intermediate characteristic between the long-term memory and the short-term memory and a level of stability of information to be stored in the neural network. Accordingly, it is possible to effectively solve the stability-plasticity dilemma found in the existing neural networks and to construct a memory system further closer to biologically functional characteristics of the human brain.

FIG. 1 illustrates an example of a structure of a feed-forward spiking neural network according to an example embodiment. Referring to FIG. 1, an information storage system according to an example embodiment may convert general information 101, for example, a text, an image, etc., to a temporal pattern 102 of a spike representing, for example, a neural activity, and may store the temporal pattern in a spiking neural network 103.

The information storage system may include a neural network system that enables pattern learning and information storage by applying an STDP to the spiking neural network 103. Here, the STDP is a single type of unsupervised learning rule.

Figure 2:
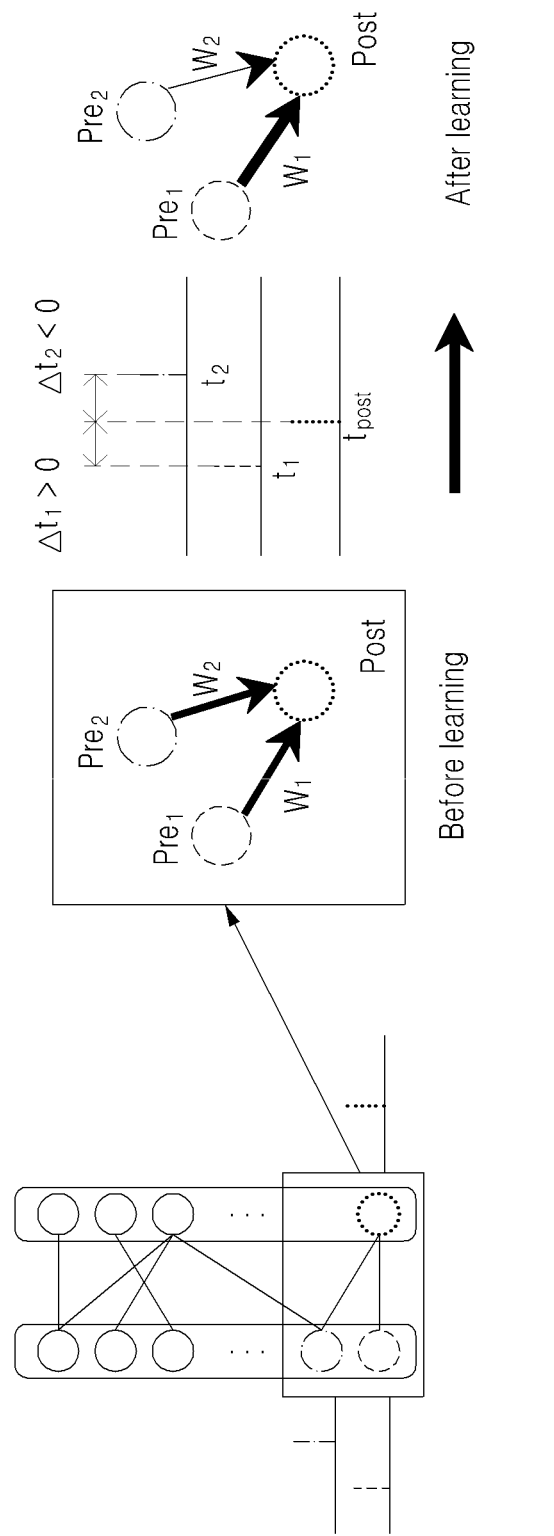
FIG. 2 illustrates an example of describing a spike-timing-dependent plasticity (STDP) learning rule used in a spiking neural network according to an example embodiment.

FIG. 2 illustrates an example of an STDP learning rule used in a spiking neural network according to an example embodiment. The STDP refers to a learning rule that changes a synaptic strength between an input neuron and an output neuron based on a temporal difference between an input spike and an output spike. Referring to FIG. 2, if the input spike comes before the output spike ($\Delta t > 0$), the synaptic strength is strengthened, that is, w increases. If the output spike comes before the input spike ($\Delta t < 0$), the synaptic strength is weakened, that is, w decreases.

Figure 3A:
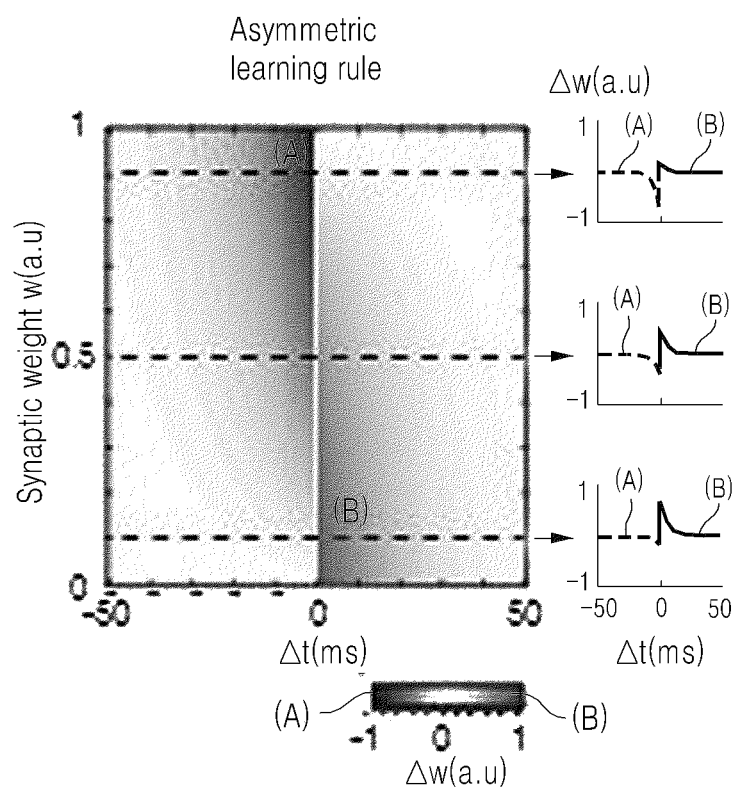
FIGS. 3A and 3B are graphs showing a change in an STDP profile for controlling learning of new information and sustainability of existing memory according to an example embodiment.
Figure 3B:
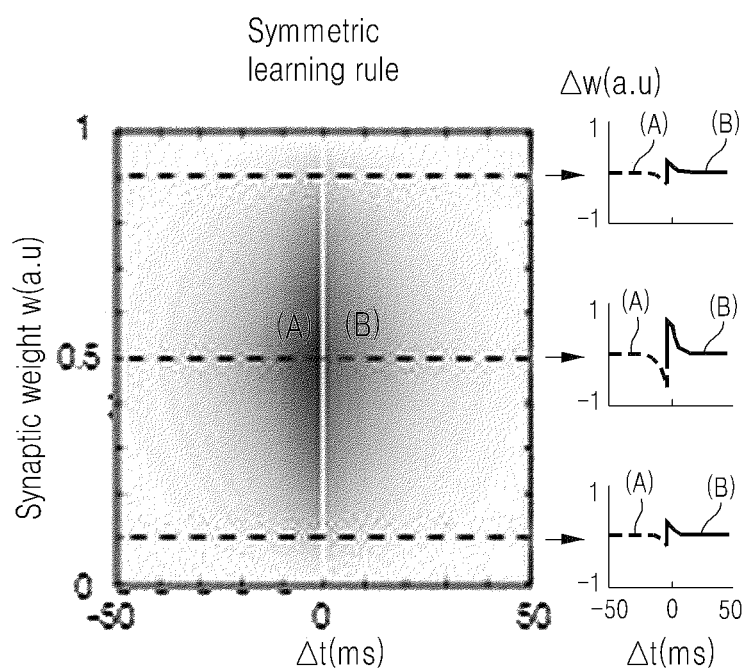

FIGS. 3A and 3B are graphs showing a change in an STDP profile for controlling learning of new information and sustainability of existing memory according to an example embodiment. FIG. 3A illustrates an example of an asymmetric learning rule of a short-term memory model in which an existing memory is easily replaceable with new memory and a volatile memory corresponding to short sustainability of information is formed. FIG. 3B illustrates an example of a symmetric learning rule of a long-term memory model in which existing information is maintained even though new memory is appended and a non-volatile memory corresponding to permanently maintained information is formed.

That is, as a single example of controlling a stability of a learning rule, a new type of a symmetric plasticity rule different from a generally used asymmetric STDP may be employed. In this case, there may be constructed a neural network system that may maintain existing information although new information is appended and may form a non-volatile memory having a characteristic similar to a long-term memory of the human brain of which information is maintained permanently. On the contrary, if the symmetry of plasticity in a neural network is controlled to be in an asymmetric form, there may be constructed a system that may easily replace an existing memory when new information is input and may form a volatile memory of which information sustainability is relatively short, which is similar to random access memory (RAM) of a computer or a short-term memory of the human brain. Also, even in the neural network in which information is stored, a characteristic of stored information may be actively controlled by changing a form of the learning rule as above.

Figure 4:
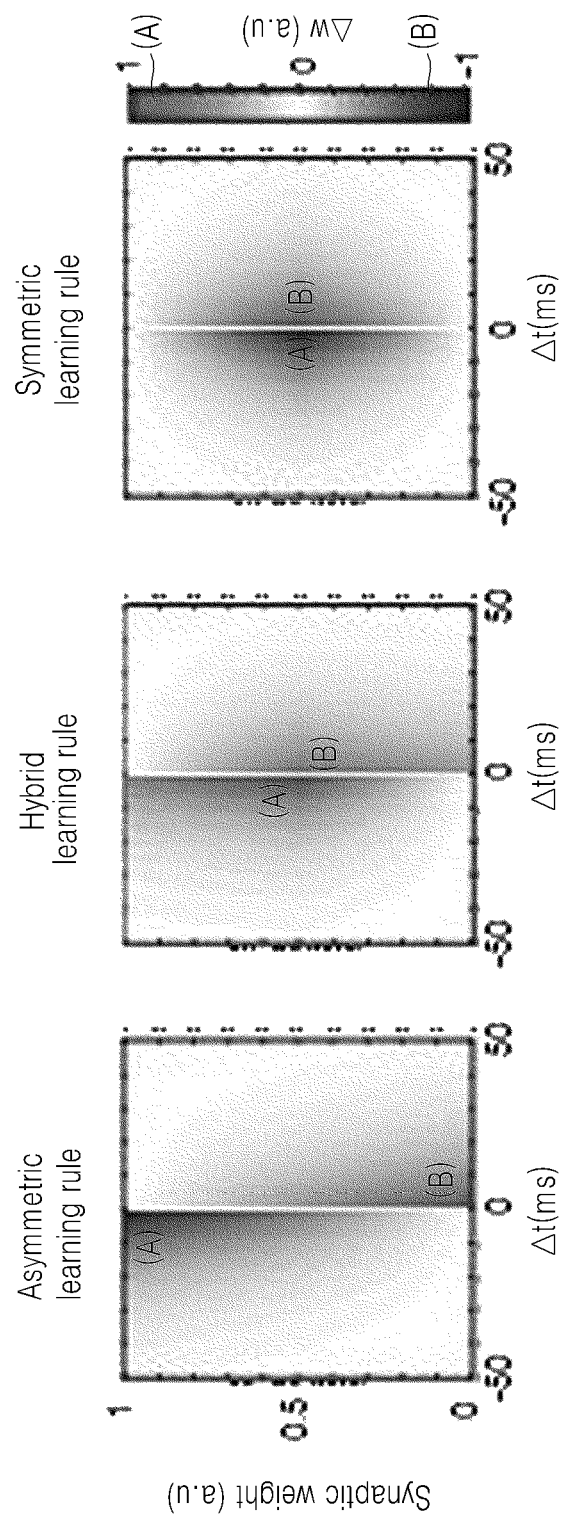
FIG. 4 illustrates an example of describing a hybrid memory model having an intermediate characteristic between a short-term memory model and a long-term memory model according to an example embodiment.

FIG. 4 illustrates an example of describing a hybrid memory model according to an example embodiment. Referring to FIG. 4, the hybrid memory model is provided in a form in which an asymmetric learning rule and a symmetric learning rule are combined at a predetermined proportion. That is, there may be provided a hybrid memory storage method that represents an intermediate characteristic between a long-term memory and a short-term memory based on an intermediate form between the symmetric learning rule and the asymmetric learning rule using principles of a short-term memory model and a long-term memory model.

Herein, a change in the STDP learning rate symmetry indicates symmetrically or asymmetrically changing a synaptic weight-dependent learning rate while maintaining a STDP kernel to be in an asymmetric shape as shown in FIGS. 3A, 3B, and 4, instead of symmetrically or asymmetrically changing an actual shape of the STDP kernel.

Hereinafter, an example embodiment of a spiking neural network and STDP modeling is described.

A biologically reasonable spiking neural network may be constructed using a leaky-integrate-and-fire (LIF) neuron model. The sustainability and stability of memory that is formed by apply a symmetric/asymmetric learning rate STDP based on the neural network may be guaranteed.

The LIF neuron model is represented as the following Equation 1.

$$C\frac{dV_j(t)}{dt} = g_L(E_L - V_j(t)) + g_j(t)(E_{syn} - V_j(t)) + I_{noise}$$ [Equation 1]

In Equation 1, C denotes a membrane capacitance, $g_L$ denotes a leak conductance, $E_L$ denotes a resting potential, and $E_{syn}$ denotes a reversal potential. In addition, $g_j$ denotes a voltage gated channel conductance and is determined by the following Equation 2.

$$\frac{dg_j(t)}{dt} = -\frac{g_j(t)}{\tau_{syn}} + c_{syn}\sum_{i \in input} w_{ij}S_i(t)$$ [Equation 2]

In Equation 2, $S_j$ denotes a spike fired by a pre-synaptic neuron, $w_{ij}$ denotes a synaptic weight between a pre-synaptic neuron and a post-synaptic neuron, and $c_{syn}$ denotes a size of excitatory postsynaptic conductance (EPSC) evoked by an input spike. When $V_j$ exceeds a specific threshold, for example, −55 mV, an action potential is generated and a neuron is evoked and, immediately after evocation, $V_j$ is reset to the resting potential.

The STDP learning rule for updating a synaptic weight between neurons by a spike timing interval between a pre-synaptic neuron and a post-synaptic neuron is represented as the following Equation 3.

$$\Delta w_{ij} = \begin{cases} \epsilon_+(w_{ij}) \cdot k_+ e^{-\frac{\Delta t}{\tau_+}} & \Delta t > 0, LTP \\ \epsilon_-(w_{ij}) \cdot k_- e^{-\frac{\Delta t}{\tau_-}} & \Delta t \leq 0, LTD \end{cases}$$ [Equation 3]

Here, the STDP learning rate symmetry may vary based on setting $\epsilon$ that denotes the synaptic weight-dependent learning rate.

An asymmetric learning rate rule of the synaptic weight-dependent learning rate may be defined as the following Equation 4.

$$\epsilon_{asym}+(w_{ij})=w_{max}-w_{ij}$$

$$\epsilon_{asym}-(w_{ij})=w_{ij}-w_{min}$$ [Equation 4]

A symmetric learning rate rule of the synaptic weight-dependent learning rate may be defined as the following Equation 5.

$$\epsilon_{sym}+(w_{ij})=\epsilon_{sym}-(w_{ij})=2\bullet\min(w_{max}-w_{ij}, w_{ij}-w_{min})$$ [Equation 5]

Also, a hybrid learning rule through a linear combination of the asymmetric learning rate rule and the symmetric learning rule rate may be defined as the following Equation 6.

$$\epsilon_{hybrid}(w_{ij})=\alpha\epsilon_{sym}(w_{ij})+(1-\alpha)\epsilon_{asym}(w_{ij}), 0<\alpha<1$$ [Equation 6]

In Equation 6, α denotes a proportion of the symmetric learning rate rule.

The neural network disclosed herein may include LIF neurons described in Equation 1 and may include two layers, for example, 50 input neurons and 50 output neuron. Here, a synaptic connection probability between neurons may be randomly set to 0.2. A synaptic weight may be randomly initialized between 0 and 1.

Hereinafter, a learning scheme of a neural network is described.

Initially, all of the input neurons form a temporal pattern with a predetermined length, for example, 100 ms, such that every input neuron fires once with a random timing. Training is performed by repeatedly feeding the temporal pattern to the neural network a predetermined number of times, for examples 1000 times. To measure the memory efficiency of the neural network, how consistent an output pattern is acquired may be measured by inputting each of a trained pattern and an untrained pattern to the neural network. A memory index representing the memory efficiency of the neural network may be defined as the following Equation 7.

$$MI = \frac{1}{N_{pair}} \sum_{m,n \in [1:20]} \frac{S_m \cdot S_n}{N_{firing}} \quad \text{[Equation 7]}$$

In Equation 7, S denotes an output pattern and $N_{pair}$ and $N_{firing}$ denote constants used to normalize the memory index based on a total number of neurons and a number of spikes.

Figure 5A:
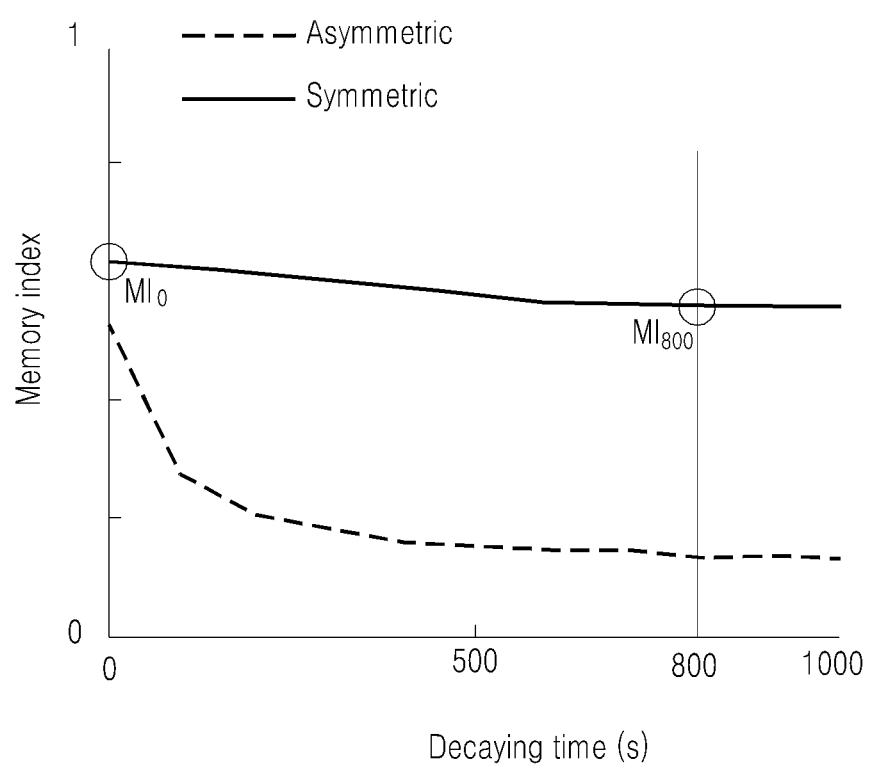
FIGS. 5A and 5B are graphs showing a result of measuring a temporal decay of memory according to an example embodiment.
Figure 5B:
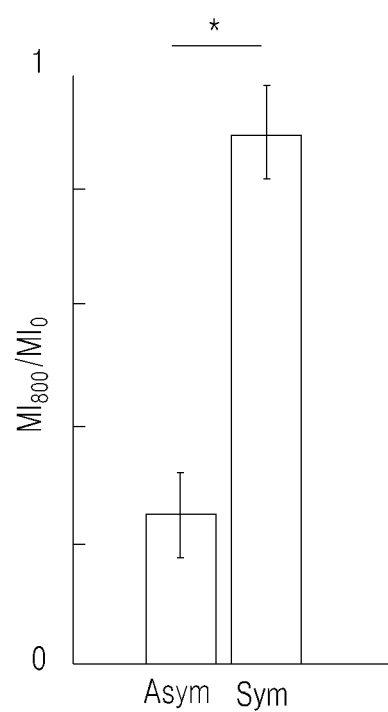

Graphs of FIGS. 5A and 5B show a memory index that varies over time in an environment which noise spikes are introduced with respect to each of a symmetric learning rate rule and an asymmetric learning rate rule. From this, it can be known that the technology proposed herein may control the memory sustainability. Referring to FIGS. 5A and 5B, a neural network using the asymmetric learning rate rule noticeably decays by repeatedly introduced noise, whereas the neural network using the symmetric learning rate rule maintains most of existing memories even against noise.

Figure 6A:
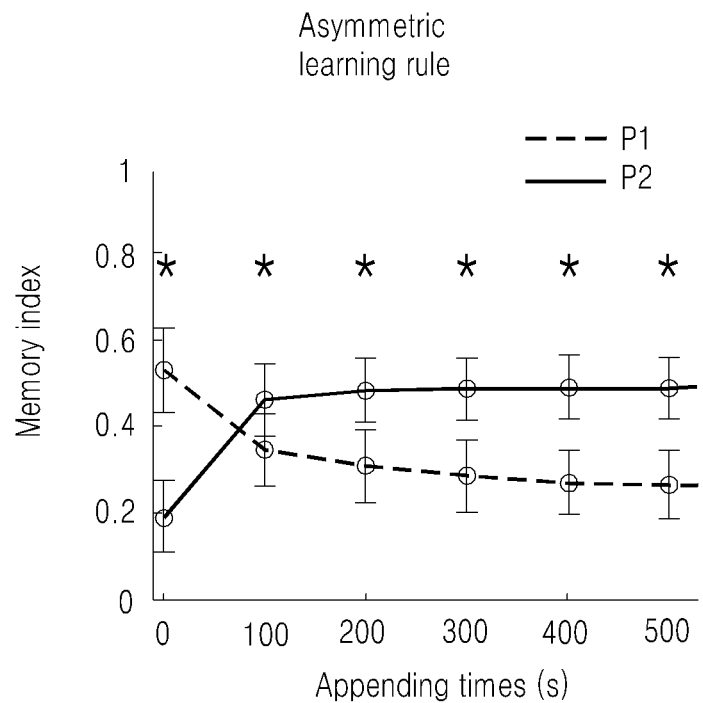
FIGS. 6A and 6B are graphs showing a result of measuring the memory efficiency of existing memory and new memory in response to appending new information according to an example embodiment.
Figure 6B:
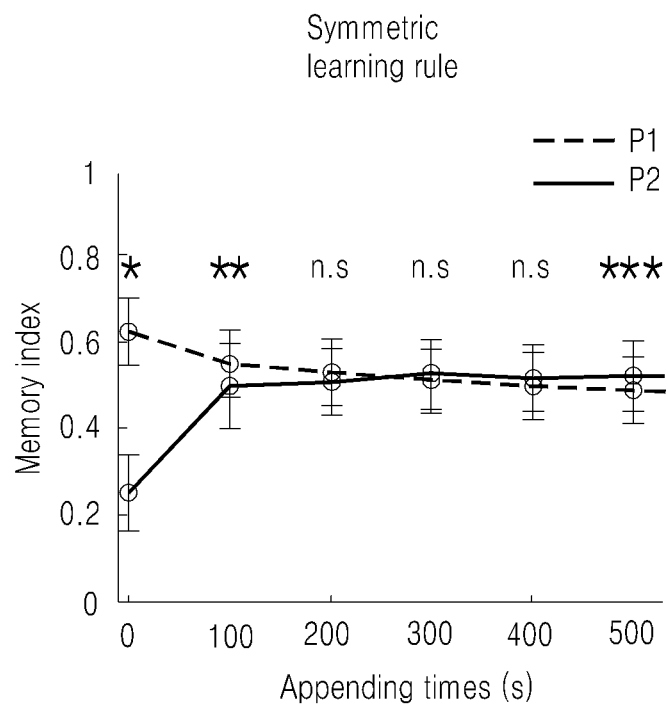

Graphs of FIGS. 6A and 6B show existing memories that vary in response to training new memories with respect to each of the symmetric learning rate rule and the asymmetric learning rate rule. From this, it can be known that the technology proposed herein may control the appendability of existing information. Referring to FIG. 6A, in the neural network using the asymmetric learning rate rule, existing memories are erased in response to appending new memories. Referring to FIG. 6B, in the neural network using the symmetric learning rate rule, existing memories are not erased. That is, information of the existing memories and the new memories may coexist.

Figure 7A:
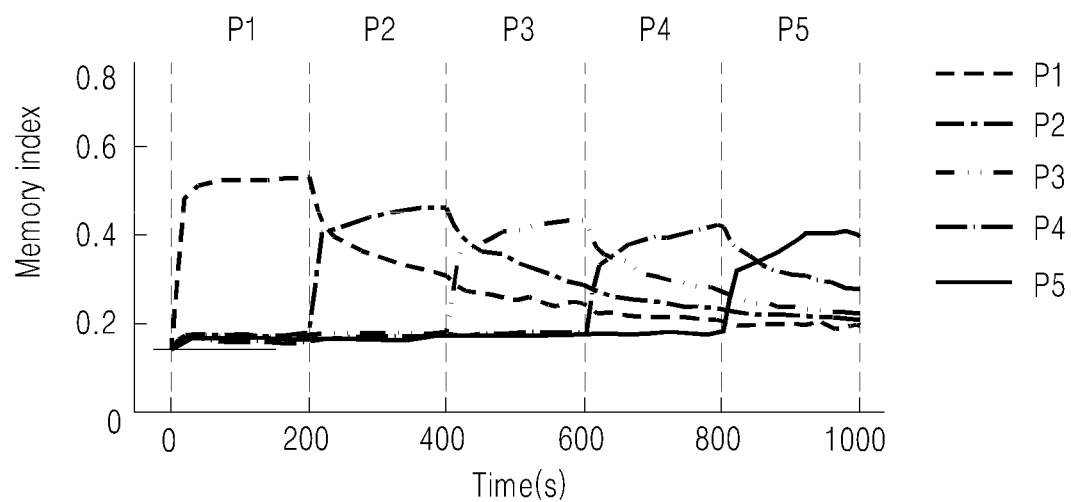
FIGS. 7A and 7B are graphs showing a result of measuring the memory efficiency of existing memory and new memory in response to sequentially appending a plurality of pieces of information according to an example embodiment.
Figure 7B:
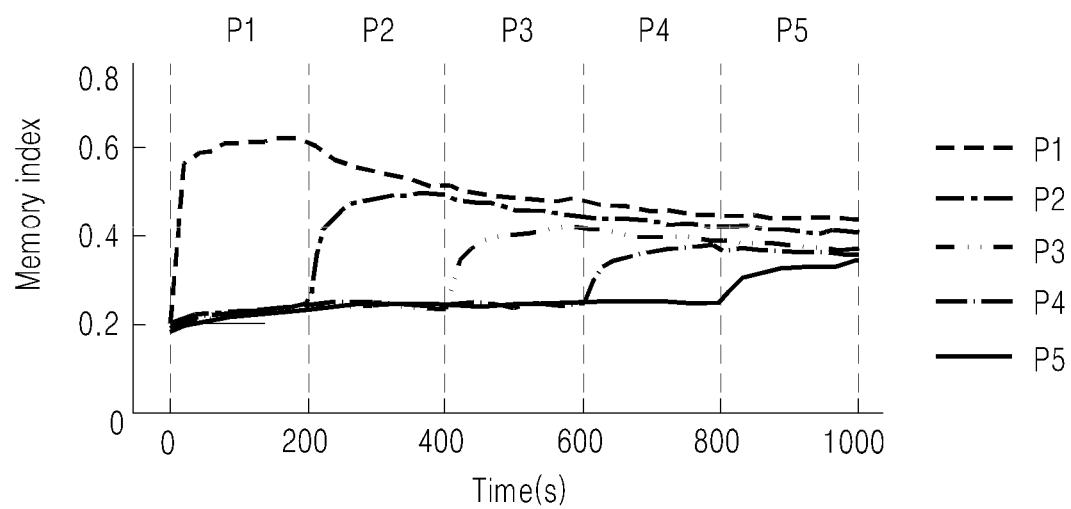

Graphs of FIGS. 7A and 7B show the efficiency of existing memories and the efficiency of new memories that are clearly compared in response to sequentially appending a plurality of pieces of information with respect to each of the symmetric learning rate rule and the asymmetric learning rate rule. Referring to FIG. 7A, in the neural network using the asymmetric learning rate rule, existing memories start to be erased and are completely decayed in response to appending new memories. Referring to FIG. 7B, in the neural network using the symmetric learning rate rule, existing memories are accumulated instead of being erased although new memories are trained. Thus, a plurality of input information patterns may be simultaneously stored.

Figure 8:
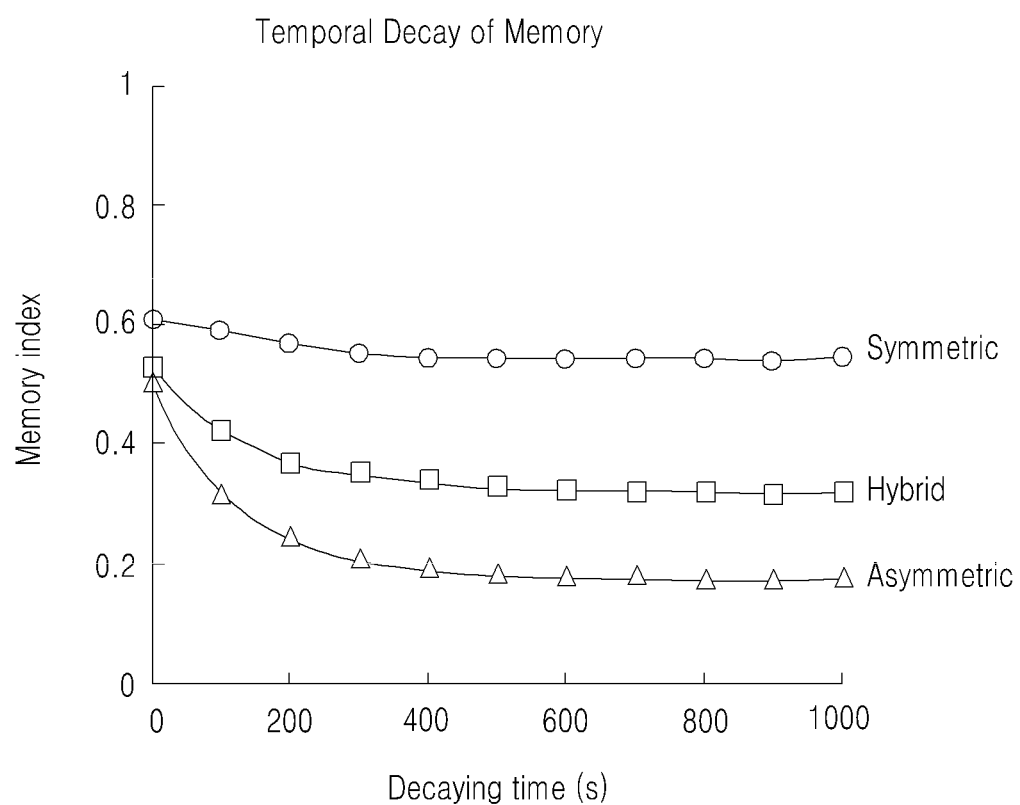
FIGS. 8 and 9 are graphs showing memory characteristics for each STDP form according to an example embodiment.
Figure 9:
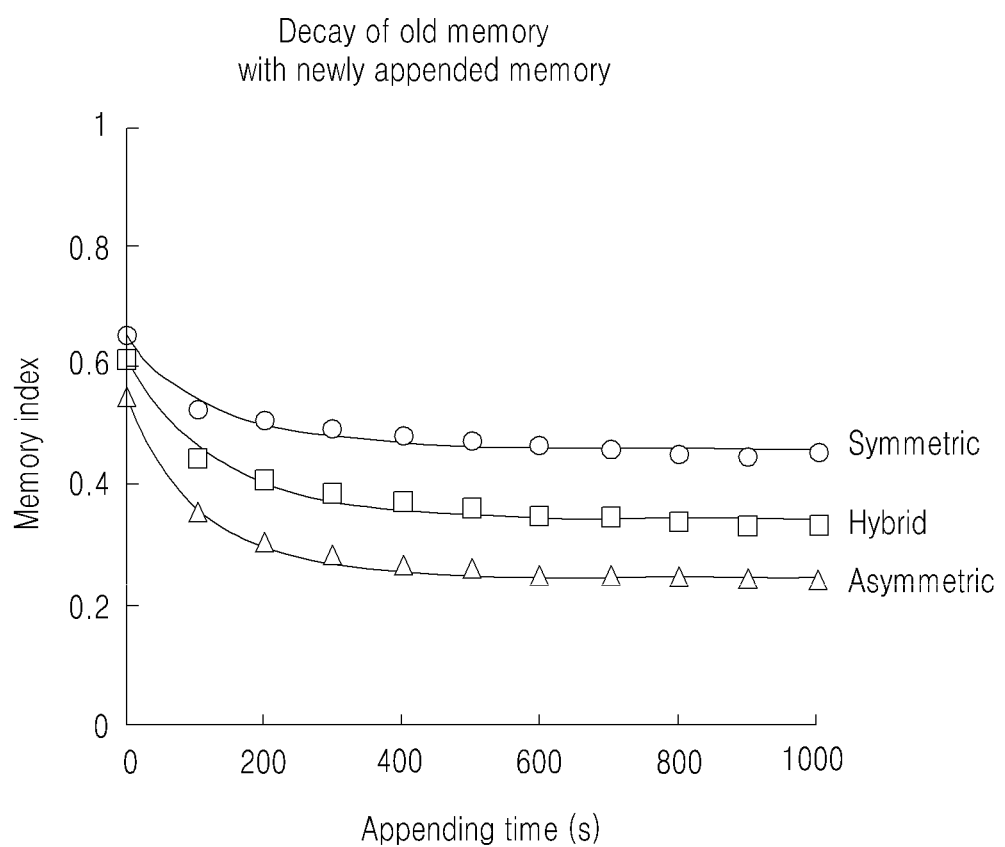

Using the same method, it is possible to measure a change in memory of the hybrid learning rule represented as Equation 6. FIGS. 8 and 9 are graphs showing memory characteristics for each STDP form.

The graph of FIG. 8 shows the sustainability of existing memories that varies over time in a memory model. Referring to FIG. 8, it can be known that a symmetric learning method may sustain stored information during a long period and an asymmetric learning method may lose information relatively fast over time. In addition, the stored information using a hybrid learning method shows an intermediate characteristic between the asymmetric learning rule and the symmetric learning rule.

The graph of FIG. 9 shows the appendability of existing information in response to adding new information. Each of the three learning methods exhibits a different result. Similar to the sustainability of information, the appendability of existing information according to the hybrid learning method exhibits an intermediate characteristic between the asymmetric learning rule and the symmetric learning rule.

Although the example embodiments describe that a characteristic of stored information is controlled by transforming the learning rate symmetry in the STDP learning rule, it is provided as an example only. Any synaptic stability-dependent scheme may be applied. The learning rate symmetry may be transformed unless the synaptic stability is greatly changed. An accurately symmetric synaptic weight-dependent learning rate may not be necessarily needed to construct the symmetric learning rule. If a learning rate is relatively low at a point at which a synaptic weight is between 0 and 1, it may operate in the same manner as the symmetric learning rule such that a synapse is stable at its minimum "0" and maximum "1". Likewise, the same STDP form as in the aforementioned example embodiment may not be necessarily needed to construct the asymmetric learning rule. If the synapse is stable at the intermediate synaptic strength, for example, 0.4, it may operate in the same manner as the asymmetric learning rule.

According to example embodiments, it is possible to further enhance the technical flexibility of a neural network system by providing functions capable of selecting or actively controlling and changing the efficiency of storing new information and the efficiency of maintaining existing information if necessary. Also, according to example embodiments, it is possible to outperform a stability-plasticity dilemma that is one of key issues of a neural network system by simply changing a learning rate symmetry of a neural network in a method of storing information in a neural network.

The example embodiments may be applicable to the overall industry and products using a spiking neural network. For example, a balance between the sustainability of existing information and learning of new information may be actively controlled by applying the example embodiments to an artificial intelligence robot that uses the spiking neural network as a memory. Examples of technology using the spiking neural network may include systems using a neural network as a key algorithm, such as deep-learning, cognitive computing, artificial vision, and robot control. In many cases, a learning memory system needs to be mounted. Thus, the methods proposed herein may be significantly applied. For example, the learning rule and system disclosed herein may be applied to design neuromorphic storage device hardware that copies the human brain. Through this, it is possible to mimic biological characteristics of long-term and short-term memories of the brain.

The example embodiments may be applied to many systems using the spiking neural network. The spiking neural network relates to a structure that structurally and/or functionally copies the biological human brain regarded as the most excellent artificial system. The spiking neural system may be employed for a variety of fields that use human-level artificial functions, such as facial recognition, an autonomous driving vehicle, a smart robot control, and the like.

Also, the example embodiments may be applied to design a storage device of a neuromorphic system that is one of technologies currently most expected. Once the methods proposed herein are applied, an efficient system capable of changing a characteristic of memory may be designed by simply changing a learning rule without performing a physical operation, such as changing a hardware characteristic or a connection, which may not be performed in an existing neuromorphic chip or artificial neural network.

The information storage method according to the example embodiments may include two or more operations based on the description made with reference to FIGS. 1 through 9. The information storage system according to the example embodiment may include at least one processor configured to execute computer-readable instructions. Here, the at least one processor may perform the aforementioned information storage method.

The processing device described herein may be implemented using hardware components, software components, and/or combination thereof. For example, the processing device and the components described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include plurality of processing elements and plurality of types of processing elements.

For example, a processing device may include plurality of processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and/or data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A computer-implemented information storage method comprising:
    converting input information to a temporal pattern in a form of a spike; and
    storing the information that is converted to the temporal pattern in a spiking neural network,
    wherein the storing comprises storing information by applying, to the spiking neural network, a spike-timing-dependent plasticity (STDP) learning rule that is an unsupervised learning rule, and
    wherein the storing also comprises constructing a hybrid learning rule of a hybrid memory model having an intermediate characteristic between an asymmetric learning rule of a short-term memory model that forms an emulated volatile memory and a symmetric learning rule of a long-term memory model that forms an emulated non-volatile memory by controlling an individual synaptic stability in the STDP learning rule.

2. The method of claim 1, wherein the storing comprises controlling a characteristic of information that is stored in the spiking neural network by controlling the individual synaptic stability in the STDP learning rule.

3. The method of claim 1, wherein the storing comprises controlling a characteristic of information that is stored in the spiking neural network by transforming a learning rate symmetry in the STDP learning rule, and
    the transforming of the learning rate symmetry comprises symmetrically or asymmetrically changing a synaptic weight-dependent learning rate in the STDP learning rule.

4. The method of claim 1, wherein the storing comprises constructing an asymmetric learning rule of a short-term memory model that forms an emulated volatile memory by controlling the individual synaptic stability in the STDP learning rule.

5. The method of claim 1, wherein the storing comprises constructing a symmetric learning rule of a long-term memory model that forms an emulated non-volatile memory by controlling the individual synaptic stability in the STDP learning rule.

6. The method of claim 1, wherein the constructing of the hybrid learning rule comprises constructing the hybrid learning rule through a linear combination of the asymmetric learning rule and the symmetric learning rule.

7. The method of claim 1, wherein the storing comprises storing information through the STDP learning rule that changes a synaptic strength between an input neuron and an output neuron in the spiking neural network based on a temporal difference between an input spike and an output spike.

8. The method of claim 7, wherein the STDP learning rule strengthens the synaptic strength when the input spike comes before the output spike and weakens the synaptic strength when the output spike comes before the input spike.

9. A computer-implemented information storage method comprising:
    converting input information to a temporal pattern in a form of a spike; and
    storing the information that is converted to the temporal pattern in a spiking neural network,
    wherein the storing comprises storing information by applying a spike-timing-dependent plasticity (STDP) learning rule to the spiking neural network, and by constructing an asymmetric learning rule of a short-term memory model that forms an emulated volatile memory, a symmetric learning rule of a long-term memory model that forms an emulated non-volatile memory, and a hybrid learning rule of a hybrid memory model having an intermediate characteristic between the asymmetric learning rule and the symmetric learning rule by controlling an individual synaptic stability in the STDP learning rule.

10. A computer-implemented information storage system comprising:
    at least one processor configured to execute computer-readable instructions,
        wherein the at least one processor is configured to convert input information to a temporal pattern in a form of a spike, and to store the information in a spiking neural network,
        the at least one processor is also configured to store information by applying a spike-timing-dependent plasticity (STDP) learning rule to the spiking neural network, and to control a characteristic of information that is stored in the spiking neural network by controlling an individual synaptic stability in the STDP learning rule, and
        the at least one processor is further configured to store the information by constructing a hybrid learning rule of a hybrid memory model having an intermediate characteristic between an asymmetric learning rule of a short-term memory model that forms an emulated volatile memory and a symmetric learning rule of a long-term memory model that forms an emulated non-volatile memory by controlling the individual synaptic stability in the STDP learning rule.

11. The information storage system of claim 10, wherein the at least one processor is configured to control the characteristic of information that is stored in the spiking neural network by transforming a learning rate symmetry in the STDP learning rule, and
    the at least one processor is configured to symmetrically or asymmetrically change a synaptic weight-dependent learning rate in the STDP learning rule.

12. The information storage system of claim 10, wherein the at least one processor is configured to store the information by constructing an asymmetric learning rule of a short-term memory model that forms an emulated volatile memory by controlling the individual synaptic stability in the STDP learning rule.

13. The information storage system of claim 10, wherein the at least one processor is configured to store the information by constructing a symmetric learning rule of a long-term memory model that forms an emulated non-volatile memory by controlling the individual synaptic stability in the STDP learning rule.

* * * * *